(12) United States Patent
Fukui (10) Patent No.: US 7,723,231 B2
(45) Date of Patent: May 25, 2010

(54) SEMICONDUCTOR DEVICE AND METHOD OF FABRICATING THE SAME

(75) Inventor: Hironobu Fukui, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 325 days.

(21) Appl. No.: 11/889,576

(22) Filed: Aug. 14, 2007

(65) Prior Publication Data

US 2008/0044991 A1    Feb. 21, 2008

(30) Foreign Application Priority Data

Aug. 21, 2006    (JP)    ............................. 2006-224367

(51) Int. Cl.
*H01L 21/00*    (2006.01)

(52) U.S. Cl. ....................... 438/682; 438/664; 438/630

(58) Field of Classification Search ................. 438/682, 438/664, 630
See application file for complete search history.

(56) References Cited

U.S. PATENT DOCUMENTS

| | | | | |
|---|---|---|---|---|
| 6,060,387 | A * | 5/2000 | Shepela et al. ............... | 438/630 |
| 6,451,693 | B1 * | 9/2002 | Woo et al. .................... | 438/682 |
| 6,551,882 | B2 | 4/2003 | Nomachi et al. | |
| 6,657,244 | B1 * | 12/2003 | Dokumaci et al. .......... | 257/288 |
| 7,112,498 | B2 * | 9/2006 | Jung ........................... | 438/303 |
| 7,446,043 | B2 * | 11/2008 | Park et al. .................... | 438/682 |
| 2005/0142727 | A1 * | 6/2005 | Jung ........................... | 438/210 |
| 2006/0172492 | A1 * | 8/2006 | Froment et al. ............. | 438/257 |
| 2007/0059931 | A1 * | 3/2007 | Park et al. .................... | 438/682 |
| 2008/0044991 | A1 * | 2/2008 | Fukui ........................... | 438/588 |
| 2008/0197498 | A1 * | 8/2008 | Kaushik et al. ............. | 257/754 |

FOREIGN PATENT DOCUMENTS

JP    2000-269482    9/2000

OTHER PUBLICATIONS

K. Goto et al., "High Performance 35nm gate CMOSFETs with Vertical Scaling and Total Stress Control for 65nm Technology", Symposium on VLSI Technology Digest of Technical Papers, 2003.

* cited by examiner

*Primary Examiner*—Laura M Menz
(74) *Attorney, Agent, or Firm*—Foley & Lardner LLP (57) ABSTRACT

A semiconductor device including silicide layers with different thicknesses corresponding to diffusion layer junction depths, and a method of fabricating the same are provided. According to one aspect, there is provided a semiconductor device comprising a first semiconductor element device and a second semiconductor element device, wherein the first semiconductor element device includes a first gate electrode, first diffusion layers disposed to sandwich the first gate electrode, and having a first junction depth, and a first silicide layer disposed in the first diffusion layers and having a first thickness, and the second semiconductor element device includes a second gate electrode, second diffusion layers disposed to sandwich the second gate electrode, and having a second junction depth greater than the first junction depth, and a second silicide layer disposed in the second diffusion layers and having a second thickness greater than the first thickness.

16 Claims, 5 Drawing Sheets

SEMICONDUCTOR DEVICE AND METHOD OF FABRICATING THE SAME

CROSS-REFERENCE TO RELATED APPLICATIONS

This application is based upon and claims the benefit of priority from prior Japanese Patent Application No. 2006-224367, filed Aug. 21, 2006, the entire contents of which are incorporated herein by reference.

BACKGROUND OF THE INVENTION

1. Field of the Invention

The present invention relates to a semiconductor device and a method of fabricating the same and, more particularly, to a semiconductor device including a plurality of semiconductor element devices having different junction depth of the diffusion layers and a method of fabricating the same.

2. Description of the Related Art

A technique that reduces the parasitic resistance of a source/drain diffusion layer by forming a silicide layer, e.g., a cobalt silicide layer, in the diffusion layer has been used to increase the operating speed and reduce the power consumption of a semiconductor device.

The problem that micropatterning of a semiconductor device makes the sheet resistance of a silicide layer nonuniform between an area where spacing between adjacent gate electrodes is 0.5 μm or less and an area where the gate electrode spacing is wider than that is pointed out (e.g., Jpn. Pat. Appln. KOKAI Publication No. 2000-269482). This is so because when the gate electrode spacing decreases, the film thickness of a siliciding metal deposited on the surface decreases, and this decreases the thickness of a silicide layer to be formed. The technique disclosed in the above patent forms a very thin oxide film (about 0.7 nm thick) on the surface of a diffusion layer in which a silicide layer is to be formed, and deposits a siliciding metal while heating the substrate (to about 200° C.). This technique thus suppresses the silicidation reaction in an area where the gate electrode spacing is wide, thereby forming a silicide layer having a uniform sheet resistance regardless of the gate electrode spacing over the entire semiconductor wafer surface.

BRIEF SUMMARY OF THE INVENTION

According to one aspect of the present invention, there is provided a semiconductor device comprising a first semiconductor element device and a second semiconductor element device disposed on a semiconductor substrate, wherein the first semiconductor element device includes: a first gate electrode disposed on a first gate dielectric on the semiconductor substrate; first diffusion layers disposed in the semiconductor substrate to sandwich the first gate electrode, and having a first junction depth; and a first silicide layer disposed in each of the first diffusion layers and having a first thickness, and the second semiconductor element device includes: a second gate electrode disposed on a second gate dielectric on the semiconductor substrate; second diffusion layers disposed in the semiconductor substrate to sandwich the second gate electrode, and having a second junction depth greater than the first junction depth; and a second silicide layer disposed in each of the second diffusion layers and having a second thickness greater than the first thickness.

According to another aspect of the present invention, there is provided a semiconductor device fabricating method comprising: forming isolations in a semiconductor substrate defining a surface of the semiconductor substrate into a first semiconductor region and a second semiconductor region and having an upper portion projecting from the semiconductor substrate; forming a first gate electrode on a first insulator on the semiconductor substrate in the first semiconductor region, and a second gate electrode on a second insulator on the semiconductor substrate in the second semiconductor region; forming first diffusion layers having a first junction depth in the semiconductor substrate in the first semiconductor region to sandwich the first gate electrode, and second diffusion layers having a second junction depth greater than the first junction depth in the semiconductor substrate in the second semiconductor region to sandwich the second gate electrode; forming first sidewall insulators on side surfaces of the first gate electrode and the second gate electrode; forming third diffusion layers having a third junction depth greater than the first junction depth in the semiconductor substrate in the first semiconductor region to sandwich the first gate electrode and the first sidewall insulators, and fourth diffusion layers having a fourth junction depth greater than the second junction depth and the third junction depth in the semiconductor substrate in the second semiconductor region to sandwich the second gate electrode and the first sidewall insulators; forming second sidewall insulators on the side surfaces of the first sidewall insulators on the first gate electrode and side surfaces of the isolation in the first semiconductor region; and forming a first silicide layer having a first thickness in the third diffusion layer by using the first gate electrode, the first sidewall insulators, and the second sidewall insulators as masks, and a second silicide layer having a second thickness greater than the first thickness in the fourth diffusion layer by using at least the second gate electrode and the first sidewall insulators as masks.

DETAILED DESCRIPTION OF THE INVENTION

The present invention provides a semiconductor device including a plurality of semiconductor element devices with different junction depths of diffusion layer, and having silicide layers with different thicknesses corresponding to the junction depth of the diffusion layers, and a method of fabricating the same.

The embodiments of the present invention will be described with reference to the accompanying drawings. The accompanying drawings, which are incorporated in and constitute a part of the specification, illustrate embodiments of the invention, and together with the general description given above and the detailed description of the embodiments given below, serve to explain principles of the invention. Throughout the drawings, corresponding portions are denoted by corresponding reference numerals. The embodiments are only examples, and various changes and modifications can be made without departing from the scope and spirit of the present invention.

When a semiconductor device is shrunk and the gate electrode spacing between adjacent metal insulator semiconductor field effect transistors (MISFETs) becomes less than, e.g., 0.4 μm, a junction leakage current increases. The present inventors have found that, when micropatterning of a semiconductor device progresses, the distance between the junction interface of a diffusion layer and the lower surface of a silicide layer decreases to cause an increased junction leakage current. This will be explained in detail below.

Figure 1A:
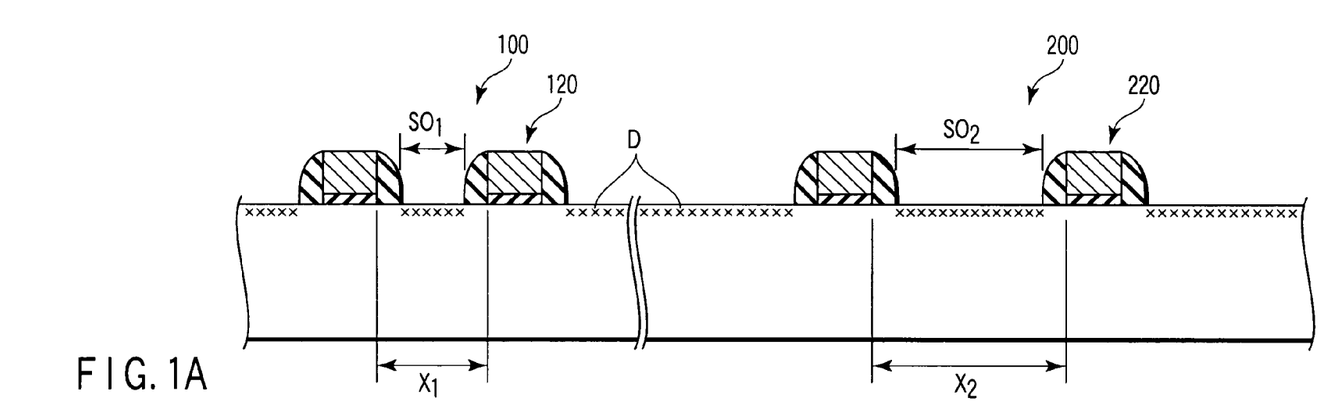
FIGS. 1A and 1B are examples of sectional views of a semiconductor device for explaining the relationship between the gate electrode spacing and the depth of the diffusion layer.
Figure 1B:
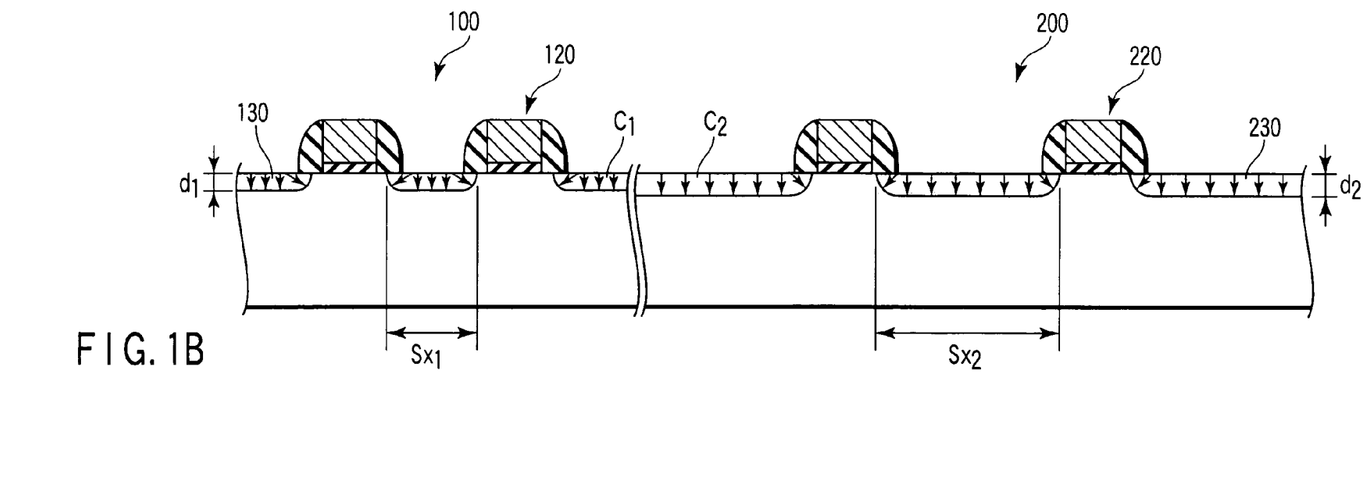
Figure 2:
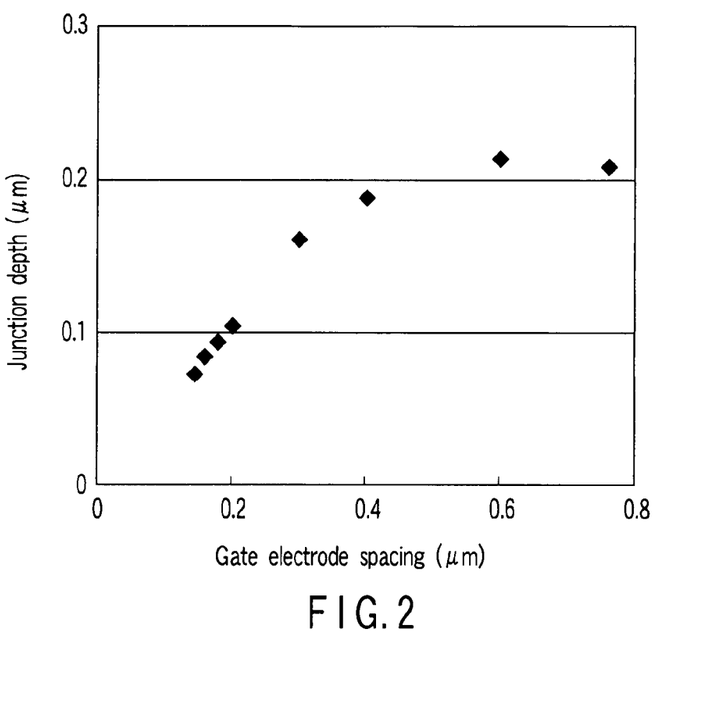
FIG. 2 is a graph for explaining the relationship between the gate electrode spacing and the junction depth of the diffusion layer.

The relationship between the gate electrode spacing and the depth of diffusion layer will be explained with reference to sectional views shown in FIGS. 1A and 1B. A diffusion layer is generally formed by ion implantation and subsequent activation annealing. Assume that a first semiconductor element device 100 (represented by suffix 1) has a narrow gate electrode 120 spacing $X_1$, and a second semiconductor element device 200 (represented by suffix 2) has a wide gate electrode 220 spacing $X_2$. When ion implantation is performed, as shown in FIG. 1A, an amount of injected dopant per unit area (dose), D (ions/cm$^2$), is constant regardless of the gate electrode spacing X. As shown in FIG. 1B, the implanted dopant isotropically diffuses in the semiconductor substrate by activation annealing. In other words, the implanted dopant diffuses not only in the depth direction but also in the lateral direction. As a result of the diffusion, when the gate electrode spacing decreases, the ratio of a diffused area Sx to an ion implanted area S0 increases (i.e., $Sx_1/S0_1 > Sx_2/S0_2$, where $S0_1 < S0_2$). (Note, S actually represents the area, however, as shown in the example in FIG. 1B, no lateral diffusion occurs in the direction perpendicular to the paper because the device is isolated by isolations in that direction. Therefore, the area ratio is effectively equal to the length ratio shown in FIG. 1B.) Consequently, in the first semiconductor element device 100 in which the gate electrode 120 spacing $X_1$ is narrow, an effective dopant concentration C of the diffused area Sx decreases ($C_1 = D \times S0_1/Sx_1 < C_2 = D \times S0_2/Sx_2$, where $S0_1 < S0_2$). The decrease in dopant concentration decreases an effective diffusion rate of the dopant, and decreases a junction depth d of the diffusion layer. That is, a junction depth $d_1$ of a diffusion layer 130 of the first semiconductor element device 100 in which the gate electrode 120 spacing $X_1$ is narrow is shallower than a junction depth $d_2$ of a diffusion layer 230 of the second semiconductor element device 200 in which the gate electrode 220 spacing $X_2$ is wide ($d_1 < d_2$). FIG. 2 shows the relationships between the gate electrode spacing X and junction depth of the diffusion layer d obtained by simulation. As shown in FIG. 2, when the gate electrode spacing becomes less than 0.4 μm, the junction depth of the diffusion layer d drastically decreases.

A silicide layer is formed basically the same as the diffusion layer; the narrower the gate electrode spacing, the thinner the silicide layer. However, the thickness of the silicide layer is generally about ⅓ or less the junction depth of the diffusion layer. In the silicide layer formation process, therefore, the diffusion length of a metal element as a diffusion species in a silicon substrate is less than that of a dopant when the diffusion layer is formed. As a result, the decrease in thickness of the silicide layer caused by the lateral diffusion of the metal element is less than the decrease in junction depth of the diffusion layer.

Accordingly, as the gate electrode spacing decreases, the distance between the junction interface of the diffusion layer and the lower surface of the silicide layer decreases.

Figure 3:
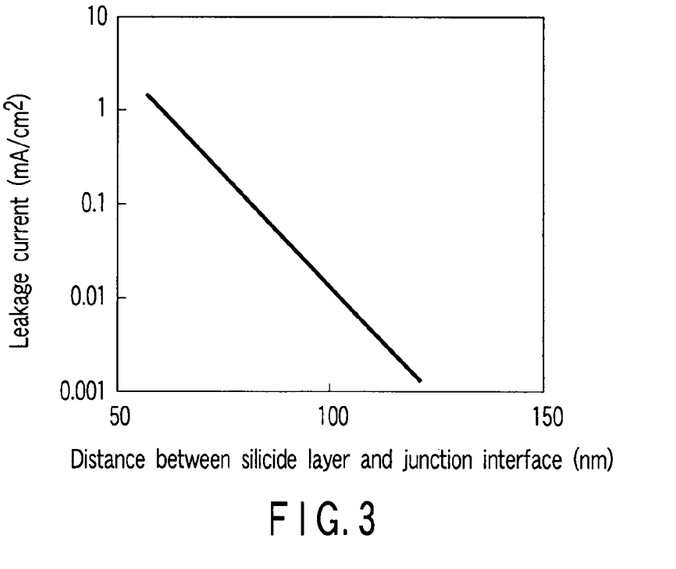
FIG. 3 is a graph showing junction leakage current as a function of the distance between the silicide layer and the junction interface.

The junction leakage current generally increases as the distance between a depletion layer generated from the junction interface of the diffusion layer and the lower surface of the silicide layer decreases. Therefore, the leakage current increases as the silicide layer thickness increases, the junction depth decreases, and/or the applied voltage rises. FIG. 3 is a graph showing junction leakage current as a function of the distance between the silicide layer and junction interface. The allowable junction leakage current is, e.g., 0.1 mA/cm$^2$, although it depends on design of the semiconductor device. For example, FIG. 3 shows that to make the junction leakage current equal to or less than the above value, the distance between the junction interface and the lower surface of the silicide layer must be 70 nm or more.

For this reason, when the junction depth of the diffusion layer is shallow, the silicide layer must be thinned. When the thickness of the silicide layer is constant throughout the semiconductor device, however, another problem arises if the silicide layer is thinned so as not to increase the leakage current of the diffusion layer having a shallow junction. In a semiconductor element device formed in an area where the gate electrode spacing is wide, the current driving power greatly depends on the diffusion layer resistance. To prevent deterioration of the current driving power, it is favorable to reduce the parasitic resistance of the diffusion layer by thickening the silicide layer. Unfortunately, thinning the silicide layer is contrary to this requirement from the viewpoint of the current driving power.

Figure 4:
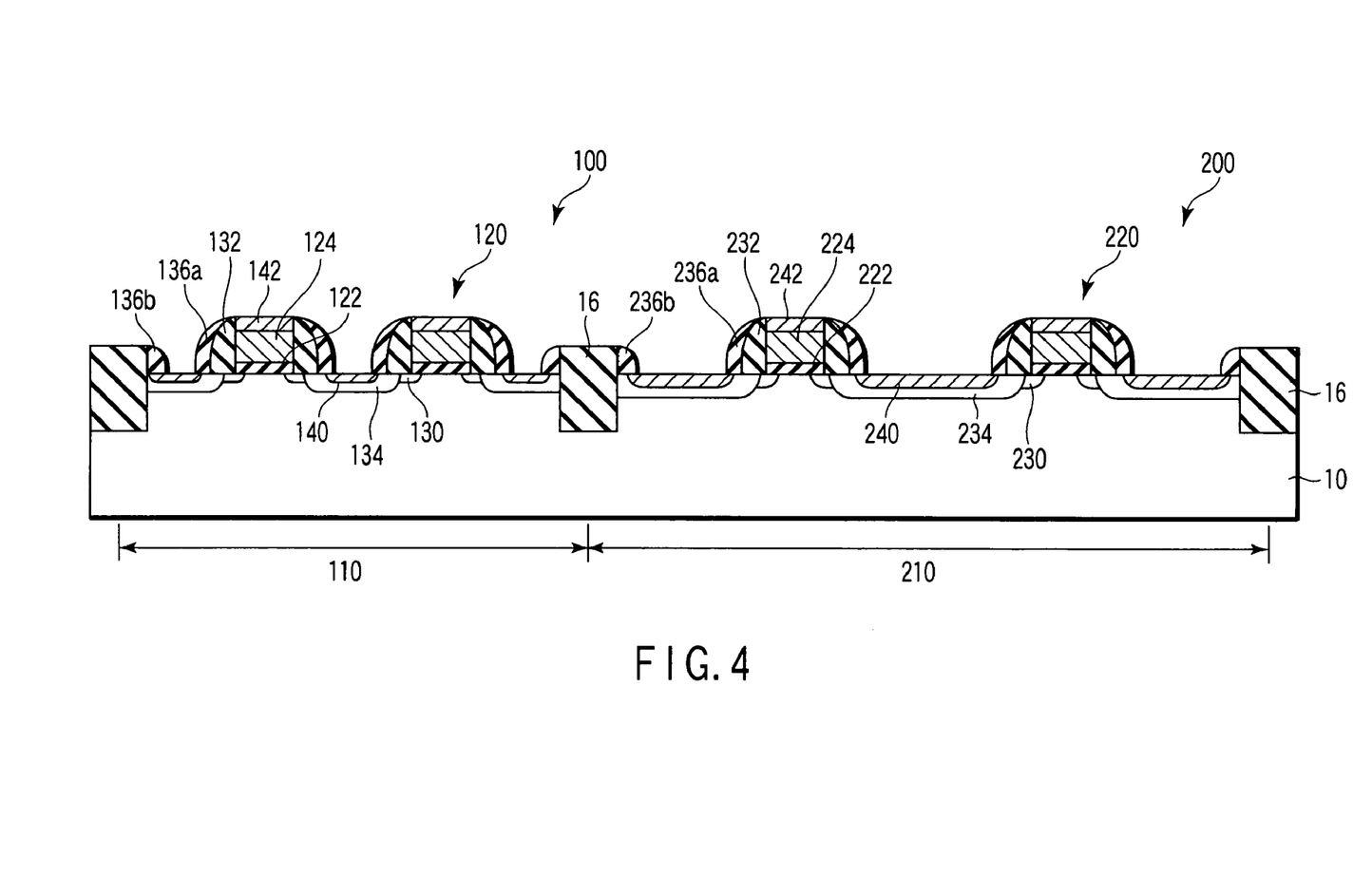
FIG. 4 is a view for explaining an example of the sectional structure of a semiconductor device according to an embodiment of the present invention.

An embodiment of the present invention provides a semiconductor device meeting the above-mentioned contradictory requirements for the silicide layer, and a method of fabricating the same. As shown in FIG. 4, a semiconductor device according to one embodiment of the present invention comprises a first semiconductor element device 100 in which the junction depth of a diffusion layer 134 is shallow, and a second semiconductor element device 200 in which the junction depth of a diffusion layer 234 is deep. A thin silicide layer 140 is formed in the diffusion layer 134 of the first semiconductor element device 100, so that the junction leakage current of the first semiconductor element device 100 is equal to or less than a desired value. A silicide layer 240 thicker than the silicide layer 140 is formed in the diffusion layer 234 of the second semiconductor element device 200, so that the current driving power of the second semiconductor element device 200 is equal to or greater than a desired value. The first semiconductor element device 100 is suitable as a transistor driven by a low voltage, in which the gate electrode 120 spacing is, e.g., 0.4 μm or less. The second semiconductor element device 200 is suitable as a transistor driven by a high voltage.

An example of a method of fabricating the semiconductor device according to the embodiment will be explained below with reference to process sectional views shown in FIGS. 5A to 5D.

Figure 5A:
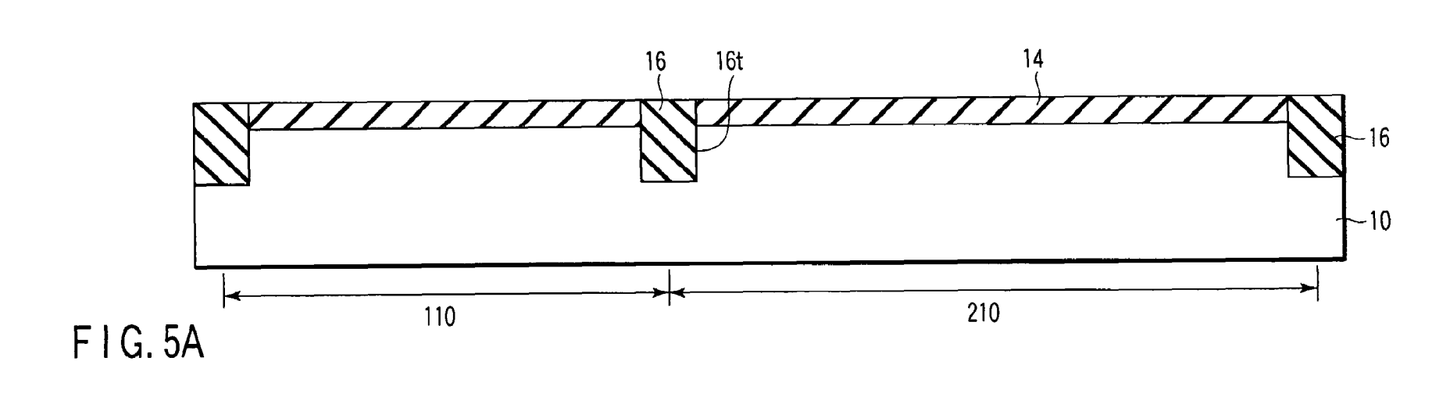
FIGS. 5A to 5D are examples of sectional views for explaining the fabrication processes of the semiconductor device according to the embodiment of the present invention.

(1) Referring to FIG. 5A, isolations 16 are formed in a semiconductor substrate 10, e.g., a silicon substrate.

The isolations 16 are preferably, e.g., shallow trench isolations (STI). First, a first mask insulator 14, e.g., a 150 nm-thick silicon nitride film ($Si_3N_4$ film), is deposited on the entire surface of the silicon substrate 10. The first mask insulator 14 on areas where the isolations 16 is to be formed is removed by lithography and etching, thereby exposing the silicon substrate 10. Furthermore, the first mask insulator 14 is used as a mask to etch the silicon substrate 10 by, e.g., reactive ion etching (RIE), thereby forming isolation trenches 16t. An isolation insulator 16, e.g., a thick silicon oxide film ($SiO_2$ film) is deposited by chemical vapor deposition (CVD) so as to fill the isolation trenches 16t. The isolation insulator 16 deposited on the surface is removed by, e.g., chemical mechanical polishing (CMP) by using the first mask insulator 14 as a stopper.

In this manner, the isolations 16 can be formed as shown in FIG. 5A. The isolations 16 not only separate adjacent semiconductor element devices, but also define a first semiconductor region 110 where the first semiconductor element device 100 is to be formed and a second semiconductor region 210 where the second semiconductor element device 200 is to be formed.

Figure 5B:
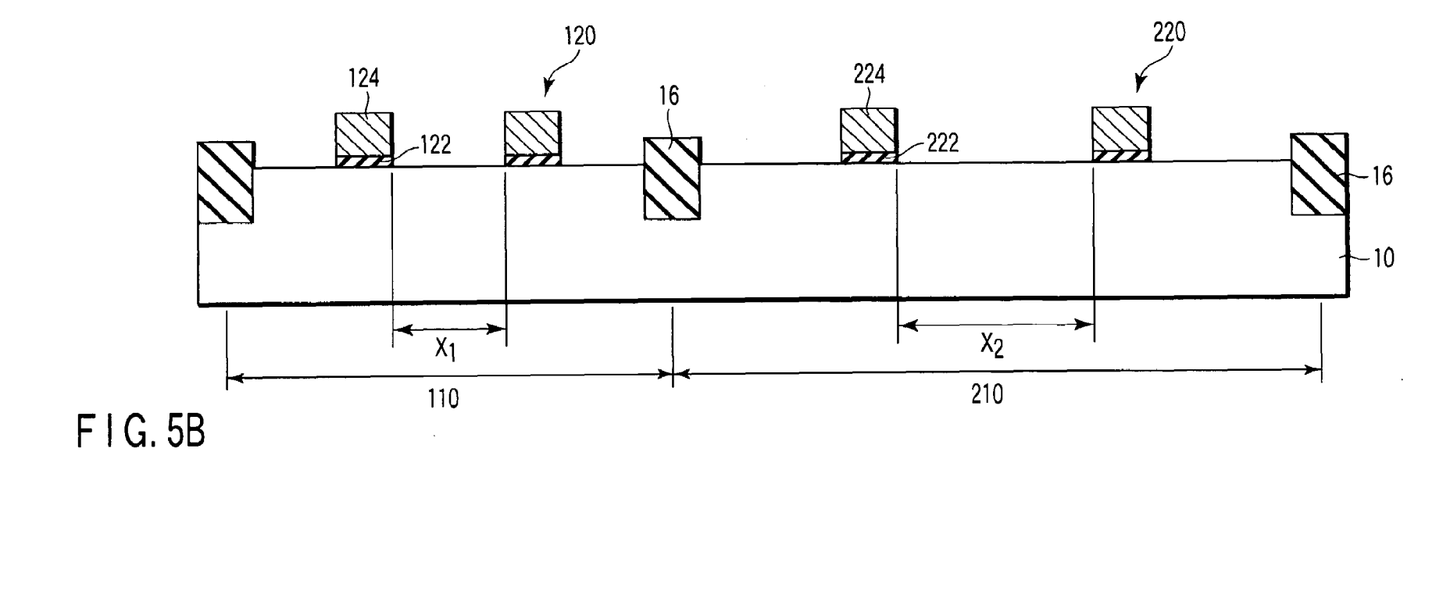

When the first mask insulator 14 is removed after that, the upper portions of the isolations 16 project from the surface of the silicon substrate 10, as shown in FIG. 5B.

(2) Next, gate electrodes 120 and 220 of the first and second transistors are formed.

Referring to FIG. 5B, first and second gate dielectrics 122 and 222 are respectively formed in the first and second semiconductor regions 110 and 210 by, e.g., thermal oxidation of the silicon substrate 10. As the first and second gate dielectrics 122 and 222, it is possible to use insulators simultaneously formed and having the same film thickness, or insulators separately formed and having different film thicknesses. A conductive film is formed on the first and second gate dielectrics 122 and 222. As the conductive film, it is possible to use, e.g., polysilicon in which phosphorus (P) is heavily doped. A second mask insulator (not shown), e.g., an $Si_3N_4$ film is deposited on the conductive film, and patterned into the shapes of first and second gate electrodes by lithography and etching. The second mask insulator is used as a mask to etch the conductive film by, e.g., RIE, thereby forming the first gate electrodes 120 each having the first gate dielectric 122 and a first conductive film 124, and the second gate electrodes 220 each having the second gate dielectric 222 and a second conductive film 224. A spacing $X_1$ between the first gate electrodes 120 adjacent to each other without disposing the isolation 16 between them is narrower than a spacing $X_2$ between the second gate electrodes 220, and is, e.g., 0.4 µm or less. The spacing $X_2$ between the second gate electrodes 220 is greater than 0.4 µm.

Figure 5C:
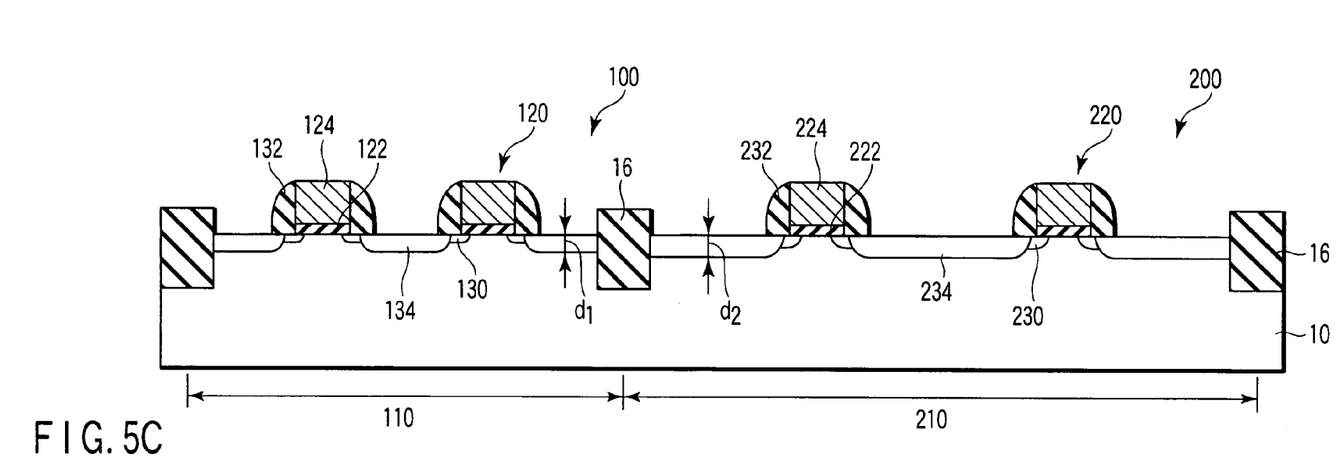

(3) Next, diffusion layers different in junction depth are formed in the first and second semiconductor regions 110 and 210, respectively.

Referring to FIG. 5C, the first gate electrodes 120 are used as masks to shallowly ion-implant a first dopant, e.g., arsenic (As), into the semiconductor substrate 10 in the first semiconductor region 110. Similarly, the second gate electrodes 220 are used as masks to shallowly ion-implant a second dopant into the semiconductor substrate 10 in the second semiconductor region 210. In these ion implantations of the first and second dopants, the same dopant can be implanted in the two regions at the same time. Alternatively, the second dopant can be an impurity different from the first dopant or can have an impurity concentration different from that of the first dopant. After that, annealing is performed to electrically activate and shallowly diffuse the ion-implanted dopants, thereby forming first diffusion layers 130 in the first semiconductor region 110, and second diffusion layers 230 in the second semiconductor region 210. Note that this annealing need not be singly performed but can also be performed jointly in a heat treatment to be performed later.

Even when the first and second dopants are simultaneously ion-implanted by using the same dopant, the junction depth of the first diffusion layer 130 is shallower than that of the second diffusion layer 230 as explained above with reference to FIGS. 1A, 1B, and 2, because the spacing between the first gate electrodes 120 on the first diffusion layer 130 is 0.4 µm or less and narrower than that of the second gate electrodes 220.

(4) A first insulator is then deposited on the entire surface in order to form first sidewall insulators 132 and 232 on side surfaces of the first and second gate electrodes 120 and 220, respectively. As the first insulator, it is possible to use, e.g., an $Si_3N_4$ film, an $SiO_2$ film, or a stacked film of these films. The first insulator deposited on the planar portion is removed by anisotropic etching, e.g., RIE, thereby forming the first sidewall insulators 132 and 232 on the side surfaces of the first and second gate electrodes 120 and 220, respectively. Although the first sidewall insulators 132 and 232 are also formed on the sidewall portions of the isolations 16 projecting from the surface of the silicon substrate 10, these sidewall insulators on the isolations 16 are generally removed by a subsequent cleaning process.

Next, ion-implantation is performed by using the first sidewall insulators 132 and 232 and the first and second gate electrodes 120 and 220 as masks, thereby forming a third diffusion layer 134 that overlaps most of the first diffusion layer 130, and a fourth diffusion layer 234 that overlaps most of the second diffusion layer 230. This ion implantation is heavier and deeper than the ion implantation of the first and second diffusion layers 130 and 230. The dopant to be implanted can be the same as the first and second dopants described above. After that, annealing is performed to electrically activate the ion-implanted dopant and diffuse it more deeply than the first and second diffusion layers 130 and 230, thereby forming the third diffusion layer 134 in the first semiconductor region 110, and the fourth diffusion layer 234 in the second semiconductor region 210. Similar to the annealing described above, this annealing need not be singly performed but can also be performed jointly in a heat treatment to be performed later.

In the third diffusion layer 134, the ion-implantation area is narrowed further because the spacing $X_1$ between the first gate electrodes 120 is 0.4 µm or less and moreover the first sidewall insulators 132 are formed. As a consequence, the effect of shallowing the diffusion layer as explained with reference to FIGS. 1A, 1B, and 2 becomes more notable than that for the first diffusion layer 130. On the other hand, in the fourth diffusion layer 234, the effect of shallowing the diffusion layer is less because the spacing $X_2$ between the second gate electrodes 220 is wide, even though the first sidewall insulators 232 are formed. As shown in FIG. 5C, therefore, a junction depth $d_1$ of the third diffusion layer 134 of the first semiconductor element device 100 is shallower than a junction depth $d_2$ of the fourth diffusion layer 234 of the second semiconductor element device 200.

In this way, the first and second semiconductor element devices 100 and 200 in which the junction depths $d_1$ and $d_2$ of the third and fourth diffusion layers 134 and 234 are different can be formed.

Figure 5D:
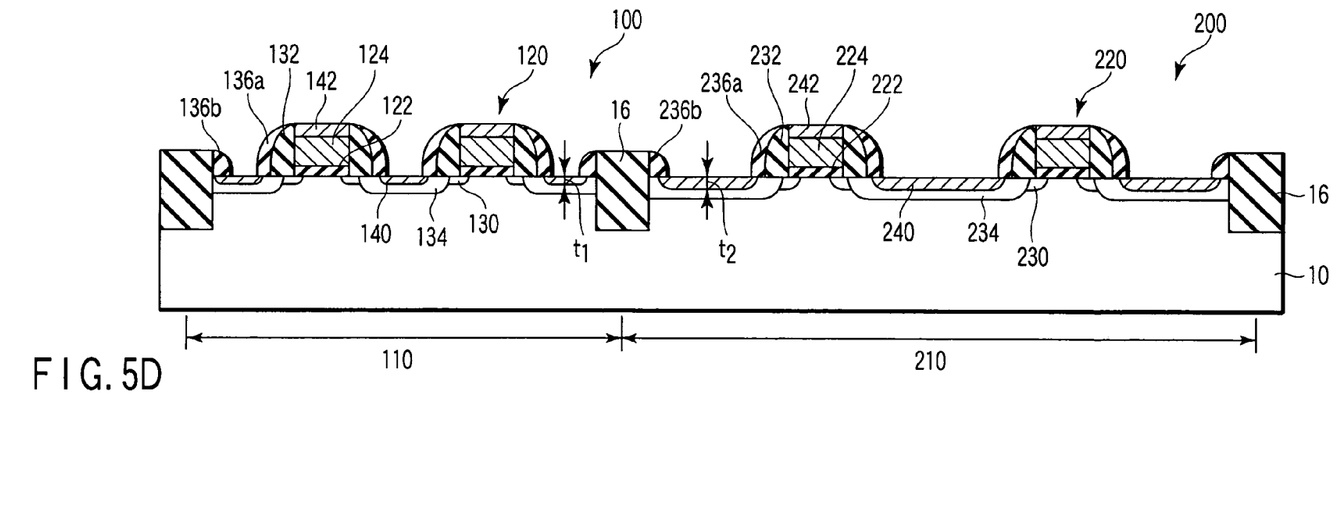

(5) Then, silicide layers 140 and 240 having different thicknesses corresponding to respective junction depths of the third and fourth diffusion layers 134 and 234 are formed.

Referring to FIG. 5D, second sidewall insulators are formed to form the thin silicide layer 140 in the third diffusion layer 134. The second sidewall insulators 136 and 236 can be formed in the same manner as for the first sidewall insulators 132 and 232. The second sidewall insulators 136 and 236 are formed not only on side surfaces (136a and 236a) of the first and second gate electrodes 120 and 220, but also on side surfaces of the isolations 16 (136b and 236b) projecting from the surface of the silicon substrate 10. Care should be taken so as not to remove the second sidewall insulators 136b and 236b formed on the side surfaces of the isolations 16, when performing cleaning after the formation of the second sidewall insulators 136, 136b and 236, 236b. The second sidewall insulators 136, 136b and 236, 236b have a function of limiting the reaction between a siliciding metal and silicon in the subsequent silicide formation process. Note that it is also possible to form no second sidewall insulators 236, 236b on the side surfaces of the second gate electrodes 220 and isolations 16 in the second semiconductor region 210.

Subsequently, a siliciding metal (not shown) is deposited on the entire surface by, e.g., sputtering. As this siliciding metal, it is possible to use, e.g., nickel (Ni), cobalt (Co), or platinum (Pt). This embodiment will be explained by taking Ni as an example.

After that, annealing is performed to form the silicide layers 140 and 240 and silicide layers 142 and 242 in the third and fourth diffusion layers 134 and 234 and on the surfaces of first and second gate electrodes 120 and 220, respectively, where the siliciding metal and silicon are in direct contact with each other. In this silicidation reaction, the silicide layers are formed in only portions where the siliciding metal and silicon are in direct contact with each other. This silicidation reaction isotropically progresses in the silicon substrate. However, in accordance with the mechanism explained above, a thickness $t_1$ of the silicide layer 140 of the first semiconductor element device 100 in which the contact area of the siliciding metal and silicon is narrow is made thinner than a thickness $t_2$ of the silicide layer 240 of the second semiconductor element device 200 in which the contact area is wide.

This makes it possible to form the thin silicide layer 140 in the third diffusion layer 134 having a shallow junction, and the thick silicide layer 240 in the fourth diffusion layer 234 having a deep junction.

After a silicidation annealing, the siliciding metal that has not reacted with silicon is removed by, e.g., wet etching. In this manner, the structure shown in FIG. 5D can be formed.

In this embodiment, in the first semiconductor element device 100 having a narrow gate electrode spacing, e.g., less than 0.4 nm, the contact area of the siliciding metal and silicon is made smaller than the area of the third diffusion layer 134. Thus, if the area of the diffusion layer 134 becomes narrow, thereby shallowing its junction depth, then the formation area of the silicide layer 140 can be automatically narrowed. Therefore, the silicide layer 140 can be automatically thinned in accordance with the junction depth. This makes it possible to prevent the silicide layer 140 from forming deeper than the junction interface of the diffusion layer 134.

After that, the semiconductor device of this embodiment is completed by performing processes necessary for the semiconductor device, such as the formation of an interlevel dielectric, multilevel interconnection, and the like.

The present invention can control the thickness of the silicide layer formed in the diffusion layer of the semiconductor element device by controlling the contact area of the siliciding metal and silicon when the silicide layer is formed. The present invention controls the contact area by forming the second sidewall insulators. When the second sidewall insulators having a predetermined film thickness are formed, the reduction ratio of the contact area increases as the gate electrode spacing decreases. Consequently, it is possible to further decrease the thickness of the silicide layer to be formed in the diffusion layer.

Accordingly, in a semiconductor element device in which a gate electrode spacing is narrow and a junction depth of a diffusion layer is shallow, the junction leakage current can be reduced due to the thinning of the silicide layer. On the other hand, in a semiconductor element device in which a gate electrode spacing is wide and a junction depth of a diffusion layer is deep, a thick silicide layer can be formed. This makes it possible to suppress the increase in parasitic resistance of the diffusion layer and thus, e.g., improve the current driving power.

The embodiment of the present invention can be variously modified when practiced. Several modifications will be explained below, but the present invention is not limited to these modifications.

According to an embodiment, in the second semiconductor element device 200 having a wide gate electrode spacing, the second sidewall insulators 236 need not be formed or can be removed after being formed. This makes it possible to further deepen or widen the silicide layer 240, thereby further improving the current driving power.

In the embodiment described above, the stacked structure of polysilicon and silicide has been explained as the gate electrode structure. According to an embodiment, it is also possible to combine a full-silicide structure, in which the whole gate electrode is silicided, with the silicide layer having a thickness corresponding to the junction depth of the diffusion layer explained above. When using the full-silicide gate electrode, the silicide of the gate electrode may be different from or the same as the silicide layer formed in the diffusion layer. In another embodiment, a metal material may also be used as the gate electrode.

Furthermore, to improve the performance of a MISFET, the present invention can also be used in combination with a structure that gives strain to a channel (see, e.g., K. Goto et al., Symposium on VLSI Technology Digest of Technical Papers, pp. 49-50, 2003). This structure can be formed by, e.g., depositing, on the entire surface, an insulator such as a silicon nitride film that gives strain after a silicide layer is formed, and thereby applying strain to a channel. To make the application of strain to the channel more effective, a silicon substrate in a diffusion area is slightly etched, e.g., etched by about 50 nm, immediately before a diffusion layer is formed, in some cases.

As has been explained above, the present invention provides a semiconductor device including a plurality of semiconductor element devices different in junction depth of the diffusion layer, and having silicide layers with different thicknesses corresponding to the junction depth of the diffusion layers, and a method of fabricating the same. This makes it possible to reduce the junction leakage current in a semiconductor element device in which a diffusion layer has a shallow junction, and improve the current driving power of a semiconductor element device in which a diffusion layer has a deep junction at the same time.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising a first semiconductor element device and a second semiconductor element device disposed on a semiconductor substrate and insulated by a shallow trench isolation with each other, wherein
the first semiconductor element device including:
a first gate electrode disposed on a first gate dielectric on the semiconductor substrate;
first diffusion layers disposed in the semiconductor substrate to sandwich the first gate electrode, and having a first junction depth; and
a first silicide layer disposed in each of the first diffusion layers and having a first thickness, and
the second semiconductor element device including:
a second gate electrode disposed on a second gate dielectric on the semiconductor substrate;
second diffusion layers disposed in the semiconductor substrate to sandwich the second gate electrode, and having a second junction depth greater than the first junction depth; and
a second silicide layer disposed in each of the second diffusion layers and having a second thickness greater than the first thickness;
the semiconductor device further comprising:
first sidewall insulators disposed on side surfaces of the first gate electrode and side surfaces of the second gate electrode; and
second sidewall insulators disposed on side surfaces of the shallow trench isolation.

2. The semiconductor device according to claim 1, wherein a distance between a junction interface of the first diffusion layer and a lower surface of the first silicide layer is not less than 70 nm.

3. The semiconductor device according to claim 1, wherein an area of the first diffusion layer is less than an area of the second diffusion layer.

4. The semiconductor device according to claim 3, wherein an area of the first silicide layer is less than an area of the second silicide layer.

5. A semiconductor device comprising a first semiconductor element device and a second semiconductor element device disposed on a semiconductor substrate and insulated by a shallow trench isolation with each other,
the first semiconductor element device including:
a plurality of first gate electrodes disposed on a first gate dielectric on the semiconductor substrate;
a plurality of first diffusion layers disposed in the semiconductor substrate to sandwich the first gate electrodes, respectively, and each having a first junction depth; and
a plurality of first silicide layers disposed on the first diffusion layers, respectively, and each having a first thickness, and
the second semiconductor element device including:
a plurality of second gate electrodes disposed on a second gate dielectric on the semiconductor substrate;
a plurality of second diffusion layers disposed in the semiconductor substrate to sandwich the second gate electrodes respectively, and having a second junction depth greater than the first junction depth; and
a plurality of second silicide layers disposed on the second diffusion layers and each having a second thickness greater than the first thickness,
wherein a spacing between the plurality of first gate electrodes adjacent to each other without disposing any isolation therebetween is less than a spacing between the plurality of second gate electrodes adjacent to each other without disposing any isolation therebetween.

6. The semiconductor device according to claim 5, wherein the spacing between neighboring ones of the plurality of first gate electrodes is not greater than 0.4 µm, and the spacing between neighboring ones of the plurality of second gate electrodes is greater than 0.4 µm.

7. The semiconductor device according to claim 5, further comprising:
first sidewall insulators disposed on side surfaces of the plurality of first gate electrodes and side surfaces of the plurality of second gate electrodes; and
second sidewall insulators disposed on side surfaces of an isolation.

8. The semiconductor device according to claim 5, wherein an area of each of the plurality of first diffusion layers is less than an area of each of the plurality of second diffusion layers.

9. The semiconductor device according to claim 8, wherein an area of each of the first silicide layers is less than an area of each of the second silicide layers.

10. The semiconductor device according to claim 1, wherein the first gate electrode and the second gate electrode include silicide layers.

11. A semiconductor device fabricating method comprising:
forming isolations in a semiconductor substrate defining a surface of the semiconductor substrate into a first semiconductor region and a second semiconductor region and having an upper portion projecting from the semiconductor substrate;
forming a first gate electrode on a first insulator on the semiconductor substrate in the first semiconductor region, and a second gate electrode on a second insulator on the semiconductor substrate in the second semiconductor region;
forming first diffusion layers having a first junction depth in the semiconductor substrate in the first semiconductor region to sandwich the first gate electrode, and second diffusion layers having a second junction depth greater than the first junction depth in the semiconductor substrate in the second semiconductor region to sandwich the second gate electrode;
forming first sidewall insulators on side surfaces of the first gate electrode and the second gate electrode;
forming third diffusion layers having a third junction depth greater than the first junction depth in the semiconductor substrate in the first semiconductor region to sandwich the first gate electrode and the first sidewall insulators, and fourth diffusion layers having a fourth junction depth greater than the second junction depth and the third junction depth in the semiconductor substrate in the second semiconductor region to sandwich the second gate electrode and the first sidewall insulators;
forming second sidewall insulators on the side surfaces of the first sidewall insulators on the first gate electrode and side surfaces of the isolation in the first semiconductor region; and
forming a first silicide layer having a first thickness in the third diffusion layer by using the first gate electrode, the first sidewall insulators, and the second sidewall insulators as masks, and a second silicide layer having a second thickness greater than the first thickness in the fourth diffusion layer by using at least the second gate electrode and the first sidewall insulators as masks.

12. The method according to claim 11, wherein forming the first silicide layer comprises setting a distance between a junction interface of the third diffusion layer and a lower surface of the first silicide layer to be not less than 70 nm.

13. The method according to claim 11, wherein forming the third diffusion layers and the fourth diffusion layers comprises making an area of the third diffusion layer less than an area of the fourth diffusion layer.

14. The method according to claim 13, wherein forming the first silicide layer and the second silicide layer comprises making an area of the first silicide layer less than an area of the second silicide layer.

15. The method according to claim 11, wherein the formation of the first gate electrode and the second gate electrode includes formation of a plurality of first gate electrodes and a plurality of second gate electrodes, and the forming the plurality of first gate electrodes and the plurality of second gate electrodes comprises making a spacing between the plurality of first gate electrodes adjacent to each other without disposing any isolation therebetween less than a spacing between the plurality of second gate electrodes adjacent to each other without disposing any isolation therebetween.

16. The method according to claim 15, wherein the spacing between neighboring ones of the plurality of first gate electrodes is not greater than 0.4 µm.

* * * * *